United States Patent
Chukka et al.

(10) Patent No.: US 9,369,161 B1
(45) Date of Patent: Jun. 14, 2016

(54) MITIGATION OF RADIO-FREQUENCY INTERFERENCE AT A REMOTE RADIO HEAD

(71) Applicant: SPRINT COMMUNICATION COMPANY L.P., Overland Park, KS (US)

(72) Inventors: Chaitanya Chukka, Overland Park, KS (US); Andrew M. Wurtenberger, Olathe, KS (US); Patrick Jacob Schmidt, Bonner Springs, KS (US); Sreekar Marupaduga, Overland Park, KS (US)

(73) Assignee: Sprint Communications Company L.P., Overland Park, KS (US)

( * ) Notice: Subject to any disclaimer, the term of this patent is extended or adjusted under 35 U.S.C. 154(b) by 127 days.

(21) Appl. No.: 14/457,855

(22) Filed: Aug. 12, 2014

(51) Int. Cl.
| | | |
|---|---|---|
| H04B 1/04 | (2006.01) | |
| H04W 88/08 | (2009.01) | |
| H04W 52/24 | (2009.01) | |
| H04B 17/336 | (2015.01) | |
| H04B 17/345 | (2015.01) | |
| H03F 1/02 | (2006.01) | |

(52) U.S. Cl.
CPC ............ *H04B 1/0475* (2013.01); *H04W 88/08* (2013.01); *H03F 1/0233* (2013.01); *H04B 17/336* (2015.01); *H04B 17/345* (2015.01); *H04B 2001/045* (2013.01); *H04B 2001/0408* (2013.01); *H04W 52/243* (2013.01)

(58) Field of Classification Search
CPC .. H04B 17/309; H04B 17/336; H04B 17/345; H04B 2001/0408; H04B 2001/0433; H04B 2001/045; H04W 52/24; H04W 52/241; H04W 52/243; H03F 1/0211; H03F 1/0233
USPC .......... 455/115.1, 115.2, 127.1, 127.2, 127.4, 455/226.1, 226.2, 226.3, 114.2, 114.3, 522
See application file for complete search history.

(56) References Cited

U.S. PATENT DOCUMENTS

| | | | | | |
|---|---|---|---|---|---|
| 5,432,473 | A * | 7/1995 | Mattila | .................... | H03F 1/302 330/133 |
| 6,043,707 | A * | 3/2000 | Budnik | .................... | H03C 5/00 330/10 |
| 7,193,459 | B1 * | 3/2007 | Epperson | ................. | H03C 5/00 330/130 |
| 2005/0135502 | A1 * | 6/2005 | Zhang | ................... | H03F 1/0261 375/297 |
| 2006/0046666 | A1 * | 3/2006 | Hara | ...................... | H03F 1/0222 455/127.1 |
| 2007/0232250 | A1 * | 10/2007 | Sun | ...................... | H04L 27/2623 455/127.1 |
| 2007/0291873 | A1 * | 12/2007 | Saito | ...................... | H03F 1/0227 375/298 |
| 2009/0258611 | A1 * | 10/2009 | Nakamura | ............... | H03C 5/00 455/108 |
| 2010/0075703 | A1 * | 3/2010 | Imai | ...................... | H04B 7/0417 455/501 |
| 2010/0216412 | A1 * | 8/2010 | Rofougaran | ........... | H04B 1/406 455/78 |
| 2014/0086081 | A1 * | 3/2014 | Mack | ...................... | H04L 5/006 370/252 |
| 2015/0124661 | A1 * | 5/2015 | He | ........................ | H04L 5/0066 370/278 |

* cited by examiner

Primary Examiner — Duc M Nguyen

(57) ABSTRACT

A method, system, and medium are provided for mitigating radio-frequency (RF) interference at a remote radio head (RRH) of a base station due to non-linearity in at least one of the RRH components. RF-interference indicators received from one or more user devices are monitored. When the RF-interference indicators indicate that RF interference at the RRH is above a predefined threshold, then a power amplifier associated with the RRH is adjusted to operate in a saturation mode thereby reducing the generation of inter-modulation products and reducing RF interference at the RRH. When the RF-interference indicators indicate that RF interference at the RRH is below the predefined threshold, then the power amplifier is adjusted to operate in an active mode thereby optimizing signal gain.

20 Claims, 6 Drawing Sheets

MITIGATION OF RADIO-FREQUENCY INTERFERENCE AT A REMOTE RADIO HEAD

SUMMARY

A high level overview of various aspects of the invention is provided here for that reason, to provide an overview of the disclosure and to introduce a selection of concepts that are further described in the detailed-description section below. This summary is not intended to identify key features or essential features of the claimed subject matter, nor is it intended to be used as an aid in isolation to determine the scope of the claimed subject matter.

In brief, and at a high level, this disclosure describes, among other things, computer-readable media, methods, and systems for dynamically mitigating radio-frequency (RF) interference at a remote radio head (RRH) of a base station due to non-linearity in one or more of the RRH's components. In one aspect, RF-interference indicators are received from one or more user devices communicating with the base station. The RF-interference indicators are used to determine the amount of RF interference at the RRH. When it is determined that RF interference is high or above a predefined threshold, at least one of the RRH components, such as a power amplifier, is adjusted so that it operates in a saturation mode. By operating in the saturation mode, non-linearity of the power amplifier is reduced resulting in less RF interference at the RRH and a cleaner output signal. Conversely, when the RF-interference indicators indicate that RF interference is low or below the predefined threshold, the power amplifier is adjusted to operate in an active mode (i.e., operate in a non-linear manner). By operating in the active mode, gain and efficiency of the power amplifier is optimized.

In a second aspect, the RRH is configured to include a first stage non-linear power amplifier that is serially-coupled to a second stage linear power amplifier. A logic unit is programmably-coupled to both the first and second power amplifiers and is utilized in part to monitor RF interference at the RRH. When RF interference at the RRH is low or below a predefined threshold, the logic unit activates only the non-linear power amplifier to optimize gain and bypasses the linear power amplifier. However, when RF interference at the RRH is high or above the predefined threshold, the logic unit activates both the non-linear and the linear power amplifiers. By doing this, output from the power amplifiers is both more linear and optimized for gain.

BRIEF DESCRIPTION OF THE FIGURES

Illustrative embodiments of the present invention are described in detail below with reference to the attached drawing figures, and wherein.

DETAILED DESCRIPTION

Figure 1:
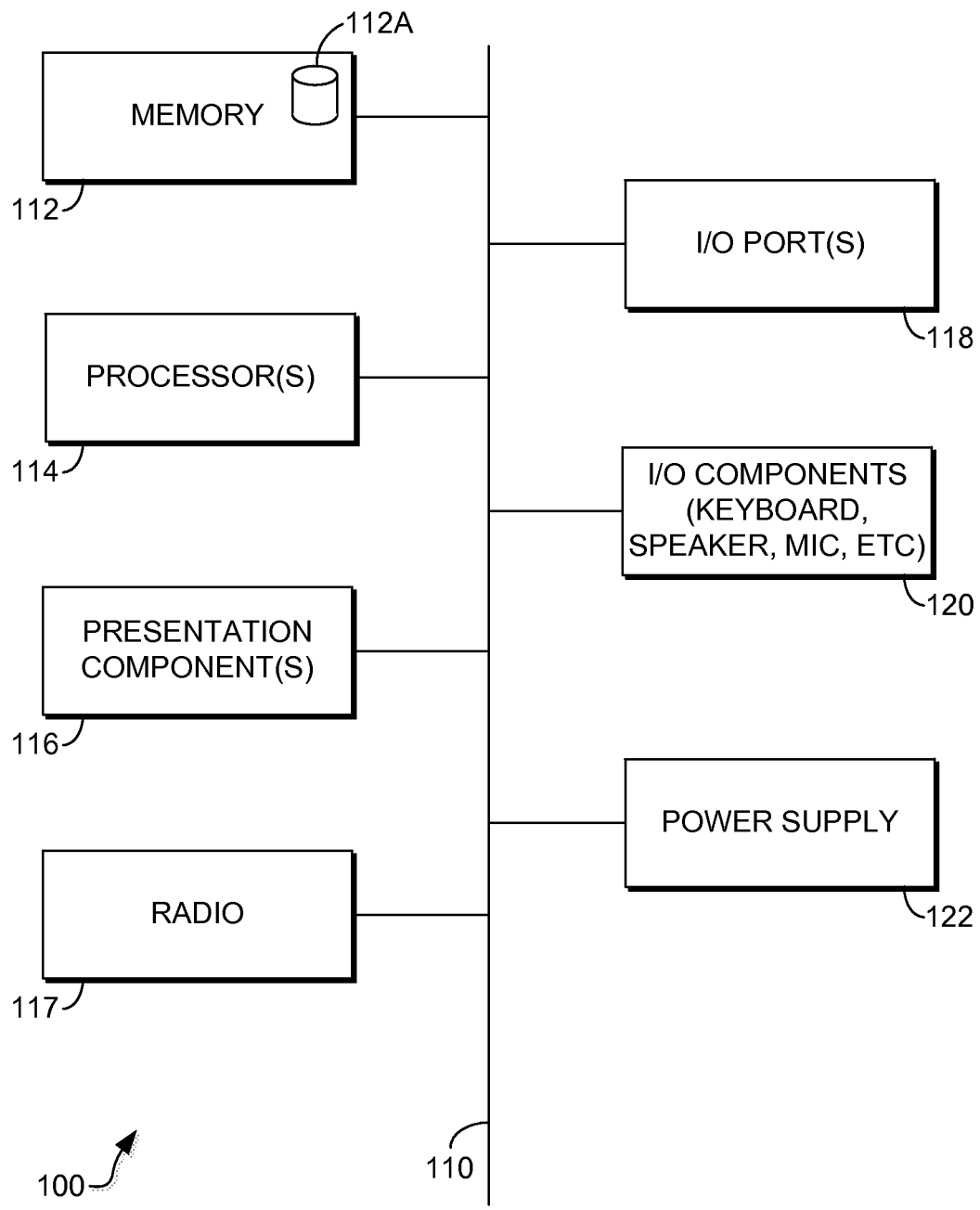
FIG. 1 depicts an exemplary user computing device according to an embodiment of the technology.

The subject matter of select embodiments of the present invention is described with specificity herein to meet statutory requirements. But the description itself is not intended to define what we regard as our invention, which is what the claims do. The claimed subject matter might be embodied in other ways to include different steps or combinations of steps similar to the ones described in this document, in conjunction with other present or future technologies. Terms should not be interpreted as implying any particular order among or between various steps herein disclosed unless and except when the order of individual steps is explicitly described.

The present invention may be embodied as, among other things, a method, system, or a set of instructions embodied on one or more computer-readable media. Aspects hereof relate to reducing RF-interference at a remote radio head (RRH) system of a base station. In one aspect, RF-interference may be reduced by monitoring RF-interference indicators received from one or more user devices communicating with the base station. When the RF-interference indicators indicate that RF interference at the RRH is high, a power amplifier associated with the RRH is set to operate in a saturation mode thereby increasing the linearity of the power amplifier and decreasing the amount of inter-modulation products generated by the power amplifier. This, in turn, reduces the amount of RF interference at the RRH and allows for a cleaner output signal. Conversely, when the RF-interference indicators indicate that RF interference at the RRH is low, the power amplifier is set to operate in an active mode. Although this mode typically produces a greater amount of inter-modulation products, it also provides the most gain to the signal. And because RF interference at the RRH is low, the generation of inter-modulation products is not as much of a concern as when RF interference at the RRH is high.

In another aspect, a RRH system may be configured to include a first power amplifier that is adapted to operate in a non-linear manner serially-coupled to a second power amplifier that is adapted to operate in a linear manner. Again RF-interference indicators received from user devices are monitored to determine the level of RF interference at the RRH system. When the RF-interference indicators indicate that RF interference at the RRH system is low, a logic unit that is programmably coupled to both the first and second power amplifiers actuates the first non-linear amplifier, and bypasses the second linear power amplifier in order to maximize signal gain. If, on the other hand, the RF-interference indicators indicate that RF interference at the RRH system is high, then the logic unit actuates both the first and second power amplifiers so as to increase gain but also to limit the non-linearity of the RRH system. By limiting non-linearity of the RRH system, the generation of inter-modulation products is reduced and RF interference is lessened.

Accordingly, in one aspect, the present invention is directed to one or more non-transitory computer-readable media having computer-executable instructions embodied thereon that, when executed, perform a method of mitigating RF-interference at a RRH system of a base station due to non-linearity in at least a portion of the RRH system components. The RRH components include at least a power amplifier that is configured to operate in at least an active mode and a saturation mode. The method comprises receiving RF-interference indicators from a plurality of user devices communicating with the base station. The RF-interference indicators are used to adjust the power amplifier such that the power amplifier operates in the active mode when the RF-interference indicators indicate that RF interference at the RRH is below a predefined threshold. The RF-interference indicators are also used to adjust the power amplifier such that the power amplifier operates in the saturation mode when the RF-interference indicators indicate that RF interference at the RRH is above the predefined threshold.

In another aspect, a remote radio head (RRH) system of a base station is provided. The RRH system comprises a first non-linear power amplifier, a second linear power amplifier; and a logic unit programmably coupled to both the first non-linear power amplifier and the second linear power amplifier. The logic unit is adapted to monitor radio-frequency (RF) interference at the RRH, activate the first non-linear power amplifier when the RF interference is below a predefined threshold, and activate the first non-linear power amplifier and the second linear power amplifier when the RF interference is above the predefined threshold.

In yet another aspect, a computerized method carried out by at least one server having at least one processor is provided for mitigating RF interference at a RRH system of a base station due to non-linearity in at least one of the RRH components. The method comprises monitoring RF-interference indicators received from a plurality of user devices communicating with the base station and determining that the RF-interference indicators indicate at least one of: 1) that RF interference at the RRH is above a predefined threshold, or 2) that RF interference at the RRH is below the predefined threshold. When the RF interference is above the predefined threshold, at least one of the RRH components is adjusted such that the at least one component is operating in a saturation mode, and when the RF interference is below the predefined threshold, the at least one component is adjusted such that the at least one component is operating in an active mode.

Throughout this disclosure, several acronyms and shorthand notations may be used to aid the understanding of certain concepts pertaining to the associated system and services. These acronyms and shorthand notations are intended to help provide an easy methodology of communicating the ideas expressed herein and are not meant to limit the scope of the present invention. Further, various technical terms are used throughout this description. An illustrative resource that fleshes out various aspects of these terms can be found in Newton's Telecom Dictionary, 27$^{th}$ Edition (2012). The following is a list of acronyms:

BER Bit Error Rate
BLER Block Error Rate
BS Base Station
CDMA Code Division Multiple Access
eNodeB Evolved Node B
FET Field-Effect Transistor
GIS Geographic Information System
2GPP 2$^{nd}$ Generation Partnership Project
3GPP 3$^{rd}$ Generation Partnership Project
GPRS General Packet Radio Service
GSM Global System for Mobile Communications
IMP Inter-Modulation Products
LTE Long-Term Evolution
MOSFET Metal-Oxide-Semiconductor FET
PA Power Amplifier
RF Radio-Frequency
RRH Remote Radio Head
RRU Remote Radio Unit
RSRP Reference Signal Received Power
RSSI Received Signal Strength Indication
SINR Signal-to-Interference-Plus-Noise Ratio
SNR Signal-to-Noise Ratio
UD User Device
WCDMA Wideband Code Division Multiple Access Further, various technical terms are used throughout this description. An illustrative resource that fleshes out various aspects of these terms can be found in Newton's Telecom Dictionary, 25th Edition (2009).

Embodiments of the present invention may be embodied as, among other things, a method, system, or set of instructions embodied on one or more non-transitory computer-readable or computer-storage media. Computer-readable media comprises physical storage devices and include both volatile and nonvolatile media, removable and nonremovable media, and contemplates media readable by a database, a switch, and various other network devices. By way of example, and not limitation, computer-readable media comprise media implemented in any method or technology for storing information. Examples of stored information include computer-useable instructions, data structures, program modules, and other data representations. Media examples include, but are not limited to computer-storage media such as information-delivery media, RAM, ROM, EEPROM, flash memory or other memory technology, CD-ROM, digital versatile discs (DVD), holographic media or other optical disc storage, magnetic cassettes, magnetic tape, magnetic disk storage, and other magnetic storage devices. These technologies can store data momentarily, temporarily, or permanently.

Referring to the drawings in general, and initially to FIG. 1 in particular, a block diagram of an illustrative user device according to one embodiment is provided and referenced generally by the numeral 100. Although some components are shown in the singular, they may be plural. For example, the user device 100 might include multiple processors or multiple radios, etc. As illustratively shown, the user device 100 includes a bus 110 that directly or indirectly couples various components together including memory 112, a processor 114, a presentation component 116, a radio 117 (if applicable), input/output ports 118, input/output components 120, and a power supply 122.

Memory 112 might take the form of memory components previously described. Thus, further elaboration will not be provided here, only to say that the memory component 112 can include any type of medium that is capable of storing information (e.g., a database). A database can be any collection of records. In one embodiment, memory 112 includes a set of embodied computer-executable instructions 112A that, when executed, facilitate various aspects disclosed herein. These embodied instructions will variously be referred to as "instructions" or an "application" for short.

The processor 114 might actually be multiple processors that receive instructions and process them accordingly. The presentation component 116 includes the likes of a display, a speaker, as well as other components that can present information (such as a lamp (LED), or even lighted keyboards).

Numeral 117 represents a radio(s) that facilitates communication with a wireless-telecommunications-network including, for example, a base station or eNodeB associated with the wireless-telecommunications-network. Illustrative wireless-telecommunications technologies include CDMA, GPRS, TDMA, GSM, and the like. The radio 117 might additionally or alternatively facilitate other types of wireless communications including Wi-Fi, WiMAX, LTE, or other VoIP communications. As can be appreciated, in various embodiments, the radio 117 can be configured to support multiple technologies and/or multiple radios can be utilized to support multiple technologies.

The input/output port 118 might take on a variety of forms. Illustrative input/output ports include a USB jack, stereo jack, infrared port, proprietary communications ports, and the like. The input/output components 120 include items such as keyboards, microphones, speakers, touch screens, and any other item usable to directly or indirectly input data into the user device 100. The power supply 122 includes items such as batteries, fuel cells, or any other component that can act as a power source to power the user device 100.

Before beginning a more detailed explanation below, a brief overview of the subject matter will be presented. RRHs are typically associated with base stations in a wireless-telecommunications-network and generally include one or more power amplifiers that operate on both the uplink channel and the downlink channel. As their name implies, power amplifiers act to increase the power of a signal. When operating on the uplink channel, the power amplifier amplifies the signal received from a user device, such as the user device 100, and when operating on the downlink channel, the power amplifier acts to amplify the signal transmitted by the base station to the user device.

Continuing, traditionally most power amplifiers have been selected or set to operate in a non-linear manner in order to achieve greater gain and to increase efficiency, where efficiency can be defined as the ratio between the power of the output signal and the total power consumption. However, one of the consequences of operating in a non-linear manner is the production of inter-modulation products. Inter-modulation products are produced when the input to the non-linear component is composed of two or more frequencies (as is the case of a power amplifier associated with a RRH system of a base station) while the output of the non-linear component includes not only the input frequencies but also linear combinations of the input frequencies. The linear combinations of the output signal can be in the form of, for example, $k_a f_a + k_b f_b$, where $f_a$ and $f_b$ are the frequencies of the input signal and $k_a$ and $k_b$ are arbitrary integers which can be positive or negative in value and which represent the inter-modulation products. The inter-modulation products can also be due to passive sources (known as passive inter-modulation (PIM)) such as junctions of dissimilar metals, metal-oxide junctions, loose connectors, and the like. Inter-modulation products may also be generated by other components of the RRH system including, for example, a radio, a mixer, and the like.

No matter what the cause of the inter-modulation products, the result is spurious emissions that can cause problems such as occupying valuable bandwidth space and causing RF interference which, in turn, can cause desensitization of the receive side of the RRH such that the RRH is unable to hear signals transmitted by user devices. Because of the desensitization of the RRH, the RRH has to re-request information from the user devices it covers and the user devices have to re-transmit the information. This not only impacts the battery life of the user devices but also consumes valuable RRH resources.

Figure 2:
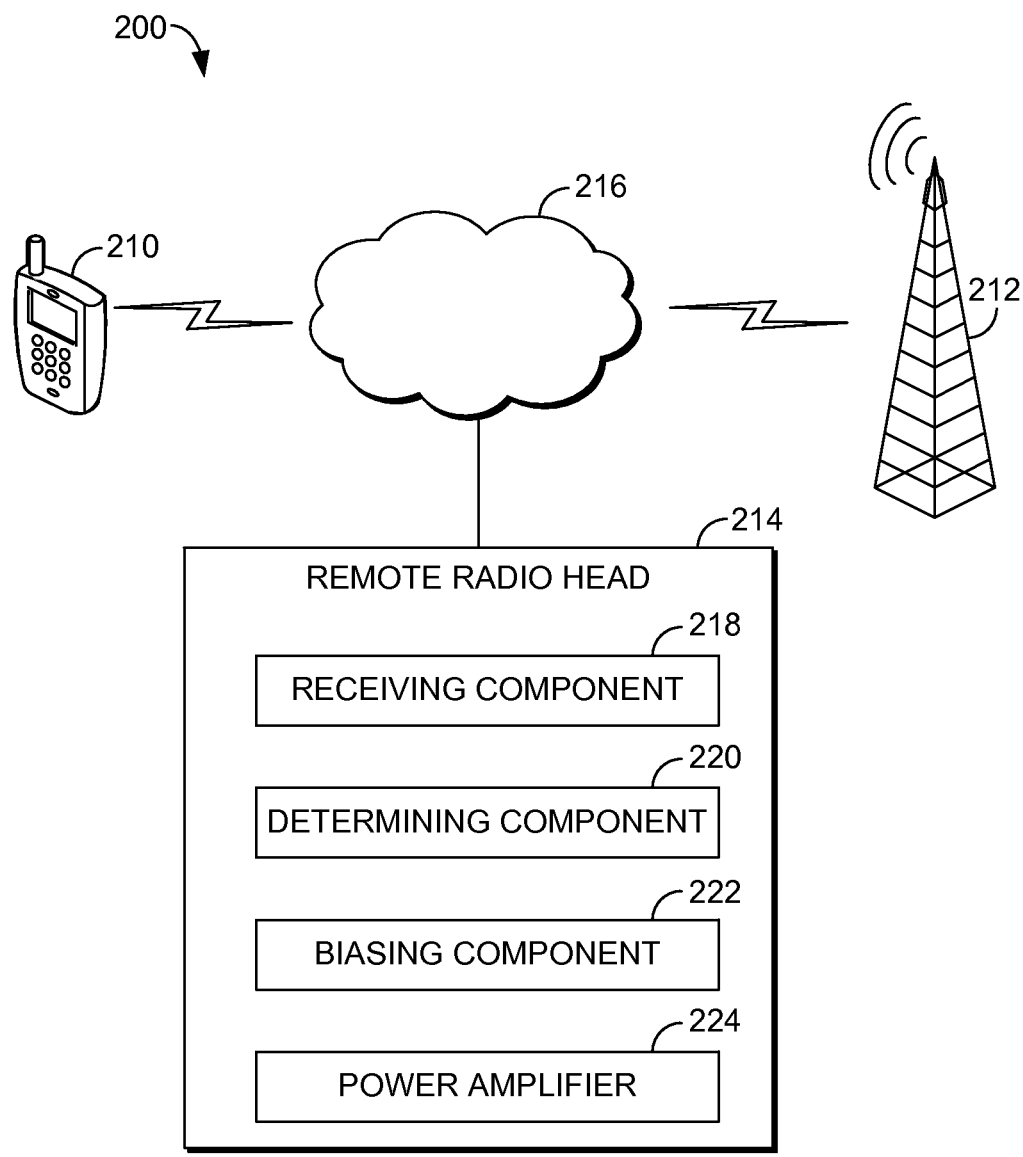
FIG. 2 depicts an illustrative operating system for mitigating RF interference at a remote radio head of a base station according to an embodiment of the invention.

With this as a background, and turning now to FIG. 2, FIG. 2 depicts an exemplary network environment 200 suitable for use in implementing embodiments of the present invention. The network environment 200 is but one example of a suitable network environment and is not intended to suggest any limitation as to the scope of use or functionality of the invention. Neither should the network environment 200 be interpreted as having any dependency or requirement relating to any one or combinations of components illustrated.

In the network environment 200, one or more user devices 210 may communicate with other devices, such as mobile devices, servers, etc. The user device 210 may take on a variety of forms, such as a personal computer (PC), a laptop computer, a tablet, a notebook, a mobile phone, a Smart phone, a personal digital assistant (PDA), or any other device that is capable of wirelessly communicating with the other devices using the network 200. The user device 210 may comprise the user device 100 of FIG. 1, and as such can include, for example, a display(s), a power source(s) (e.g., a battery), a data store(s), a speaker(s), memory, a buffer(s), and the like. In embodiments, the user device 210 comprises a wireless or mobile device with which a wireless-telecommunication-network(s) (e.g., the network environment 200) can be utilized for communication (e.g., voice and/or data communication). In this regard, the user device 210 can be any mobile computing device that communicates by way of, for example, a 3G or 4G network.

The user device 210 can utilize a network 216 to communicate with other computing devices (e.g., a mobile device(s), a server(s), a personal computer(s), etc.) and/or with a base station such as the base station 212. In embodiments, the network 216 is a telecommunications network(s), or a portion thereof. A telecommunications network might include an array of devices or components, some of which are not shown so as to not obscure more relevant aspects of the invention. Components such as terminals, links, and nodes (as well as other components) can provide connectivity in some embodiments. The network 216 can include multiple networks, as well as being a network of networks, but is shown in more simple form so as to not obscure other aspects of the present invention. The network 216 can be part of a telecommunications network that connects subscribers to their immediate service provider. In embodiments, the network 216 can be associated with a telecommunications provider that provides services to user devices, such as the user device 210. For example, the network 216 may provide voice and/or data services to user devices or corresponding users that are registered to utilize the services provided by a telecommunications provider. The network 216 can be any communication network providing voice and/or data service(s), such as, for example, a 1× circuit voice, a 3G network (e.g., CDMA, CDMA2000, WCDMA, GSM, UMTS), or a 4G network (WiMAX, LTE, HSDPA).

The network environment 200 may include a database (not shown). The database may be similar to the memory component 112 of FIG. 1 and can be any type of medium that is capable of storing information. The database can be any collection of records. In one embodiment, the database includes a set of embodied computer-executable instructions that, when executed, facilitate various aspects disclosed herein. These embodied instructions will variously be referred to as "instructions" or an "application" for short.

The network environment 200 also includes the base station 212 and a remote radio head (RRH) 214. The base station 212 may, in an LTE network, be known as an eNodeB. The base station 212 may be associated with the network 216 and communicate with, for instance, the user device 210. The communication may involve receiving signals from the user device 210 and transmitting signals to the user device 210. The components of network environment 200 have been illustrated separately but may, in fact, be integrated into a single component. For instance, the RRH 214 may be a component of the base station 212.

The RRH 214 includes at least a receiving component 218, a determining component 220, a biasing component 222, and one or more power amplifiers 224 (one of which is shown in FIG. 2). The receiving component 218 is adapted to, among other things, receive information associated with a communication signal, such as a downlink communication signal or an uplink communication signal. Part of the uplink signal (e.g., the signal received from, for example, the user device 210) may comprise a number of different RF-interference indicators communicated by the user device 210. More specifically, the receiving component 218 may be configured to monitor and receive RF-interference indicators from a plurality of user devices communicating with the RRH 214. Exemplary RF-interference indicators may include, for example, received signal strength indication (RSSI), reference signal received power (RSRP), bit error rate (BER), block error rate (BLER), signal-to-noise ratio (SNR), signal-to-interference-plus-noise ratio (SINR), and the like. Each of these indicators provides either direct or indirect information about the amount of RF interference at the RRH 214. These indicators are exemplary only and additional RF-interference indicators are contemplated as being within the scope herein.

The determining component 220 of the RRH system 214 is configured to use the RF-interference indicators received by the receiving component 218 to determine the amount of RF interference at the RRH 214. Further, the determining component 220 is configured to determine whether the amount of RF interference at the RRH 214 is within an acceptable range or is high enough that it is impairing the operations of the RRH 214 (e.g., desensitizing the RRH 214). The determining component 220 may reference a network-configured threshold number when making these determinations. For example, the determining component 220 may determine that RF interference at the RRH 214 is high when the interference is greater than the network-configured number. On the other hand, the determining component 220 may determine that RF interference at the RRH 214 is low when the interference is less than the network-configured number.

In response to the determinations made by the determining component 220, the biasing component 222 is configured to adjust the biasing voltage or biasing power of the power amplifier 224 so that is operates in a saturation mode or an active mode. To better understand this distinction, the power amplifier 224 used in the RRH 214 includes a transistor that generates the signal gain. More specifically, the power amplifier 224 generally includes a type of transistor known as a field-effect transistor (FET), and even more specifically a metal-oxide semiconductor FET (MOSFET). These types of transistors are known in the art and are generally configured to operate in one of three different modes—cutoff, active, and saturation—by adjusting the biasing voltage of the transistor. The MOSFET transistor in particular is configured to rapidly switch between these different modes. At a high level, the transistor is turned off in the cutoff mode. In the active mode, small changes in the base current cause large changes in the collector current, and in the saturation mode, small changes in the base current cause very little change in the collector current. A practical result of these different modes is that the most gain and the highest efficiency are achieved when the transistor operates in the active mode. However, when operating in the active mode, the power amplifier 224 exhibits non-linear characteristics resulting in the production of inter-modulation products and increasing RF interference at the RRH 214. Conversely, when the transistor operates in the saturation mode, gain and efficiency are reduced but the power amplifier operates in a more linear manner with a resultant decrease in the production of inter-modulation products and RF interference at the RRH 214.

Figure 3:
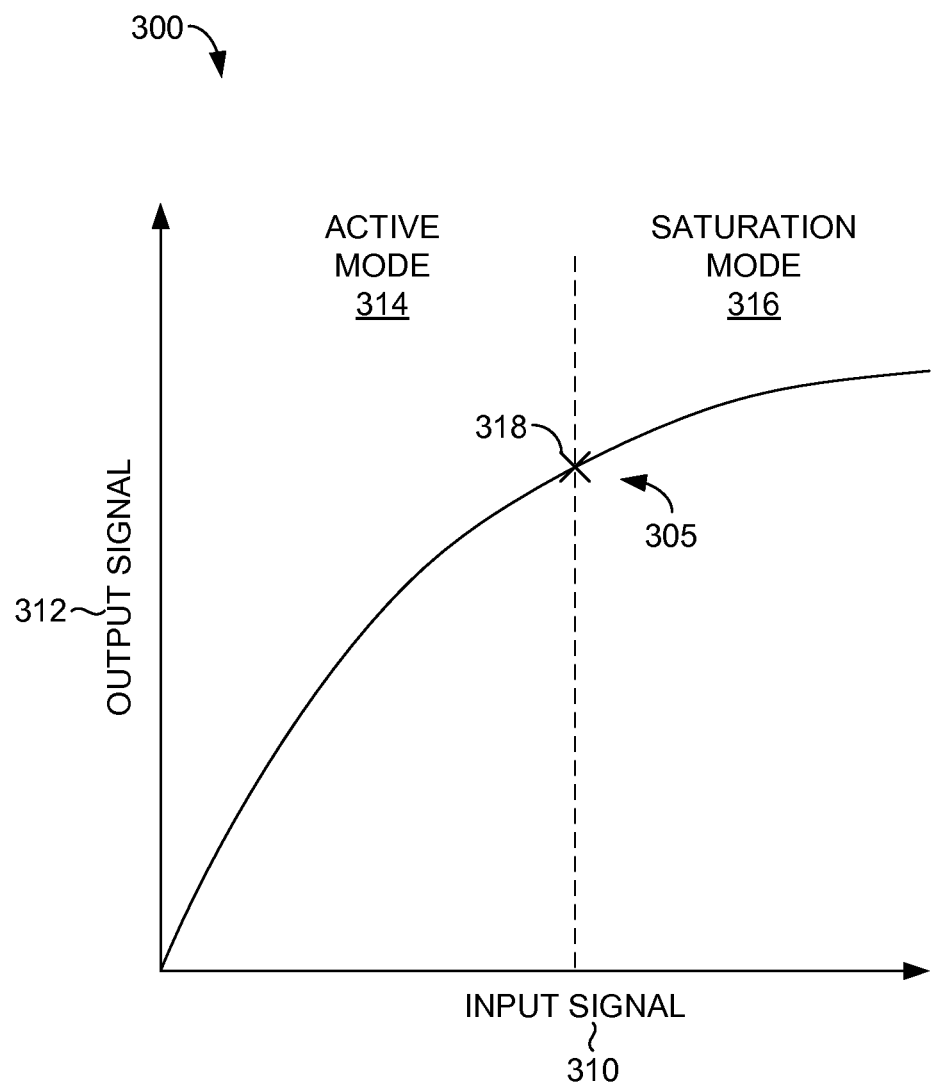
FIG. 3 depicts an exemplary graph illustrating a relationship between an input signal and an output signal when a power amplifier is operating in an active mode and a saturation mode according to an embodiment of the invention.

The difference between the power amplifier 224 operating in the active mode and the saturation mode is illustrated graphically in FIG. 3. FIG. 3 depicts a graph 300 in which input signal strength 310 (measured in dBm) is plotted on the x-axis and output signal strength 312 (measured in dBm) is plotted on the y-axis. A curve 305 is shown depicting the relationship between the power of the input signal 310 and the power of the output signal 312. When the power amplifier 224 is operating in the active mode, as shown by the reference numeral 314, a small change in input signal strength results in significant gain of the output signal 312. When the power amplifier 224 is operating in the saturation mode, as shown by the reference numeral 316, a change in input signal strength does not result in significant gain of the output signal 312. The transition between active mode 314 and saturation mode 316 is indicated by the reference numeral 316. To reiterate the point made above, the power amplifier 224 exhibits non-linear characteristics (i.e., more inter-modulation products and more RF interference) when operating in the active mode 314 and exhibits more linear characteristics (i.e., less inter-modulation products and less RF interference) when operating in the saturation mode 316. Further, the power amplifier 224 can be switched from the active mode 314 to the saturation mode 316 by adjusting the biasing voltage to the amplifier's transistor.

Figure 4:
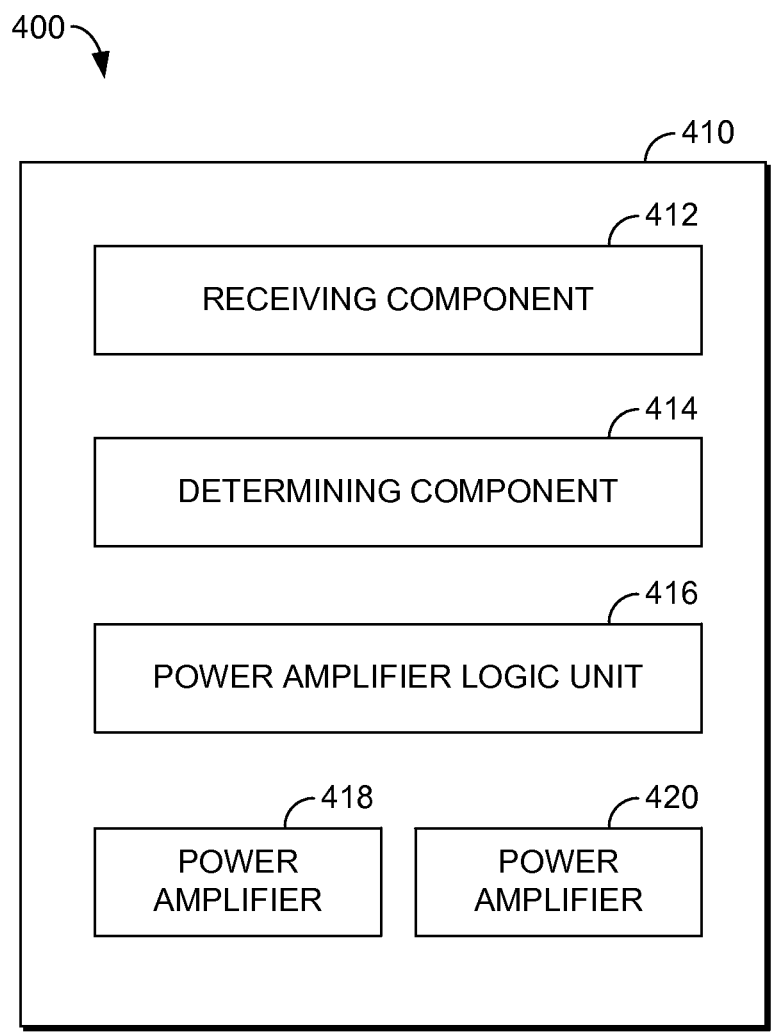
FIG. 4 depicts an illustrative operating system for mitigating RF interference at a remote radio head of a base station according to an embodiment of the invention.

Turning to FIG. 4, FIG. 4 depicts another exemplary RRH system 400 in accordance with an aspect hereof. The RRH system 400 may be used in conjunction with, or as an alternative to the RRH system 214 of FIG. 2. Like the RRH system 214, the RRH system 400 may be associated with a base station such as the base station 212 of FIG. 2. The RRH system 400 includes a receiving component 412, a determining component 414, a power amplifier logic unit 416, a power amplifier 418 and a power amplifier 420. Although separate components are shown for the receiving component 412, the determining component 414, and the power amplifier logic unit 416, in reality the different components may comprise a single logic unit that is capable of performing the operations delineated below for the separate components.

The receiving component 412 may be configured to perform similar operations as the receiving component 218 of FIG. 2 such as monitoring and receiving RF-interference indicators from a plurality of user devices communicating with the base station. As well, the determining component 414 may be configured to perform operations similar to those of the determining component 220 of FIG. 2 such as using the RF-interference indicators to determine a level of RH interference at the RRH 410 and determining whether the RF interference is above or below a network-configured threshold.

The power amplifier logic unit 416 is programmably-coupled to both the power amplifier 418 and the power amplifier 420 and is configured to activate one or both of the amplifiers 418 and 420 based on determinations made by, for example, the determining component 424.

In an exemplary aspect, the power amplifier 418 is a non-linear power amplifier and the power amplifier 420 is a linear power amplifier. In general, power amplifiers can be categorized into different classes according to, for example, their circuit configuration and their method of operation. For example, Class A amplifiers have high linearity but low efficiency and gain, while, for instance, Class E amplifiers are generally non-linear but have high efficiency and gain. Thus, in one aspect, the power amplifier 418 may comprise a Class E amplifier while the power amplifier 420 may comprise a Class A amplifier. This designation is exemplary only. As such, the power amplifier 418 may be any class whose primary characteristic is high efficiency and high gain (but low linearity), while the power amplifier 420 may be any class whose primary characteristic is high linearity (but low efficiency and gain).

In operation, the power amplifier 418 may be serially coupled to the power amplifier 420 by one or more wired connections. In this configuration, the power amplifier 418 may be configured to be the first power amplifier to receive an input signal, while the power amplifier 420 may be the second power amplifier to receive the signal after it is outputted by the power amplifier 418. Additionally, a bypass connection may be used such that after the signal is outputted by the power amplifier 418, the signal is diverted from the power amplifier 420. In other words, the bypass connection may be used to bypass the power amplifier 420.

In operation, the power amplifier logic unit 416 activates just the non-linear power amplifier 418 when it is determined that RF interference at the RRH 410 is below the network-configured threshold. Once the input signal is amplified by the power amplifier 418, the bypass connection is used to bypass the linear power amplifier 420. Because RF interference is within acceptable limits, the RRH system 410 is optimized for maximum gain by utilizing just the non-linear power amplifier 418. Conversely, when it is determined that RF interference at the RRH 410 is above the network-configured threshold, the power amplifier logic unit 416 activates both the non-linear power amplifier 418 and the linear power amplifier 420 causing the input signal to travel through both via the serial coupling between the amplifiers 418 and 420. By doing this, a balance is struck between achieving good signal gain using the power amplifier 418 while still minimizing the non-linearity of the system by utilizing the power amplifier 420.

Figure 5:
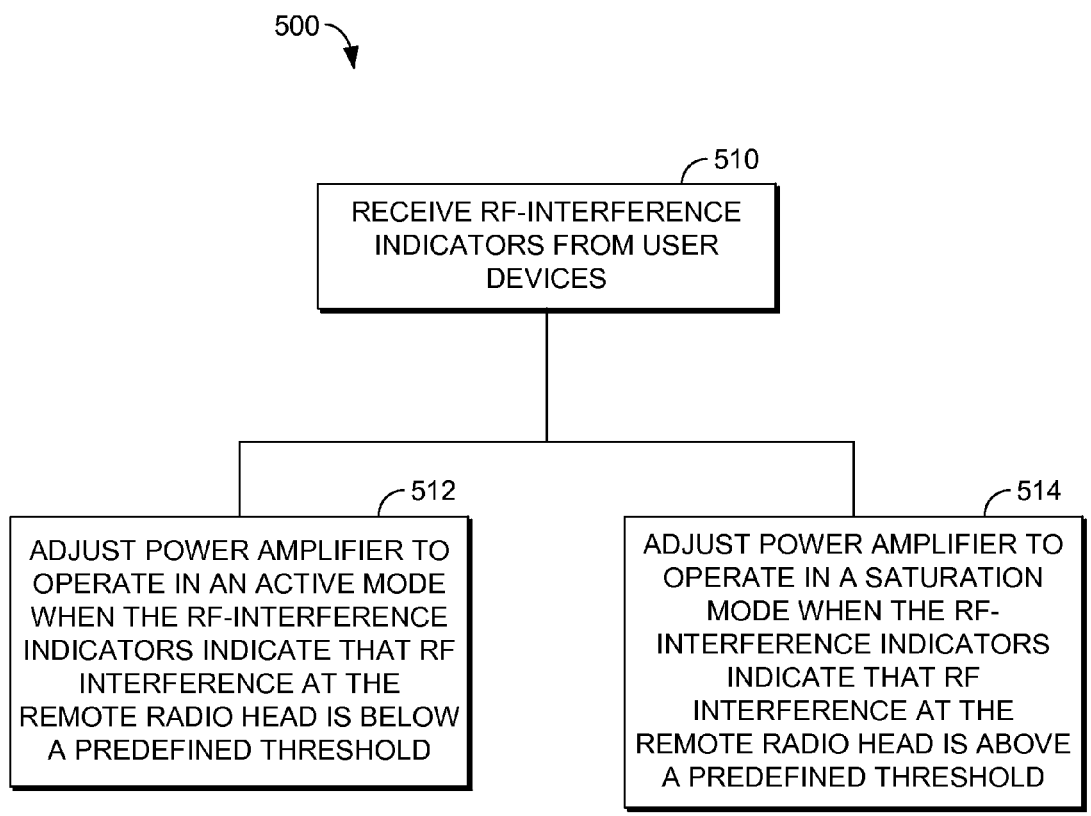
FIGS. 5-6 depict flow diagrams of exemplary methods of mitigating RF interference at a remote radio head of a base station according to embodiments of the technology.

Turning now to FIG. 5 a flow diagram is depicted of an exemplary method 500 of mitigating RF interference at a RRH system of a base station due to non-linearity in one or more of the RRH components. The RRH components include at least a power amplifier configured to operate in an active mode and a saturation mode. In some aspects, the power amplifier includes a field-effect transistor, and more particularly a metal-oxide-semiconductor FET (MOSFET) adapted to rapidly switch between the active mode and the saturation mode.

At a step 510, one or more RF-interference indicators are received from a plurality of user devices communicating with the base station. The RF-interference indicators may be received by a receiving component such as the receiving components 218 and 412 of FIGS. 2 and 4 respectively. The RF-interference indicators may comprise RSSI, RSRP, BER, BLER, SNR, SINR, and the like. When the RF-interference indicators indicate that RF interference at the RRH system is below a predefined threshold then, at a step 512, the power amplifier is adjusted so that it operates in the active mode. Adjustment may occur by altering the biasing voltage of the power amplifier. As previously stated, although operating the power amplifier in the active mode increases non-linearity of the system and possibly RF interference at the RRH, it also optimizes signal gain. Because the RF interference at the RRH is below the predefined threshold, this is an acceptable trade-off.

However, when the RF-interference indicators indicate that RF interference at the RRH system is high, then, at a step 514, the power amplifier is adjusted to operate in the saturation mode. Again, adjusting the power amplifier may comprise altering the biasing voltage such that the MOSFET switches to the saturation mode. Because the power amplifier is operating in the saturation mode, linearity of the RRH system is increased and RF interference is correspondingly decreased. A result of this is that the sensitivity of the RRH is increased which decreases the need to re-request information from the user devices.

Figure 6:
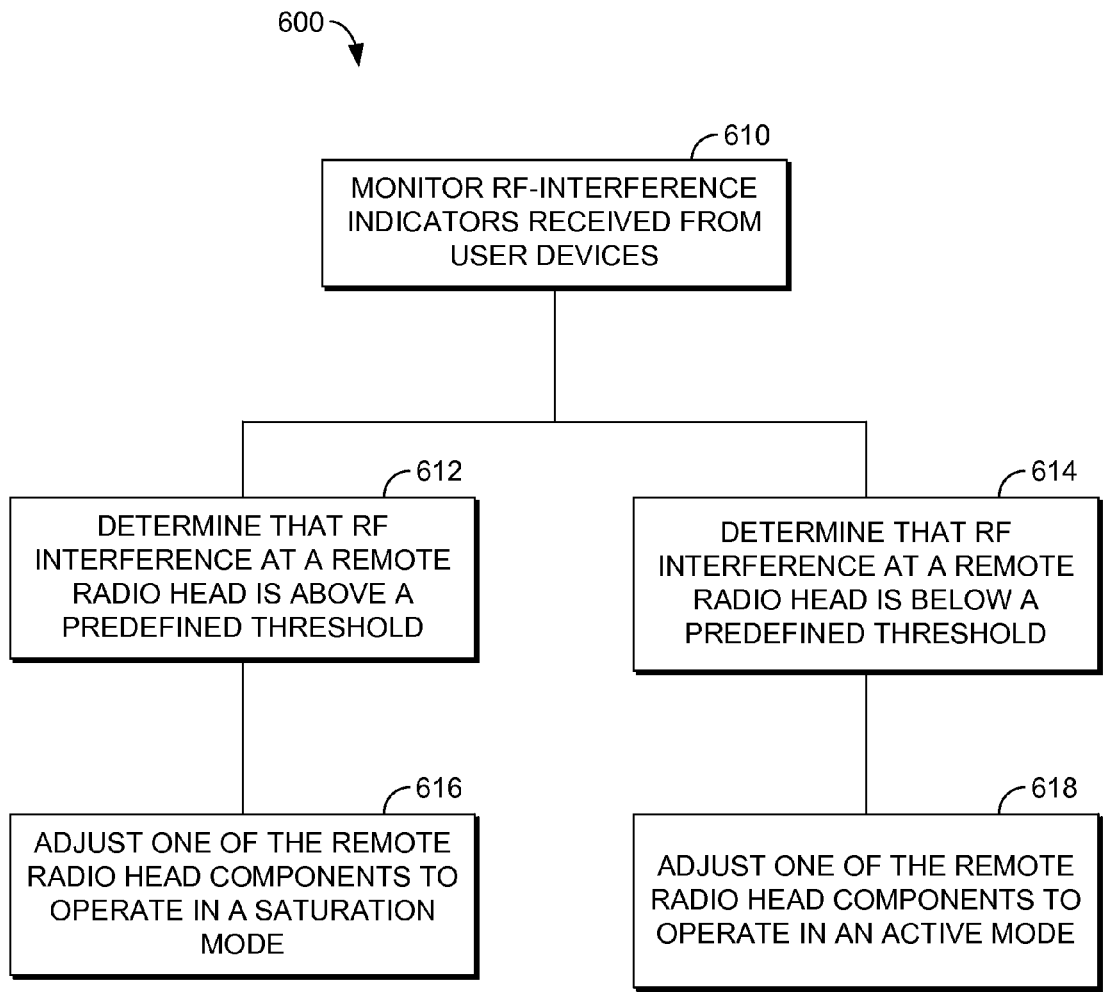

FIG. 6 depicts a flow diagram of an exemplary method 600 of mitigating RF interference at a RRH of a base station due to the production of inter-modulation products by one or more non-linear components of the RRH. The non-linear components may include power amplifiers, radios, mixers, and the like. At a step 610, RF-interference indicators received from one or more user devices communicating with the base station are monitored by, for instance, a receiving component. In one aspect, at a step 612 it is determined that the RF-interference indicators indicate that RF interference at the RRH is above a predefined threshold. The determination may be carried out by a determining component such as the determining components 220 and 414 of FIGS. 2 and 4 respectively. Continuing, at a step 616, one or more of the RRH components is adjusted to operate in a saturation mode. One of the components may comprise a power amplifier having a transistor capable of switching between the active mode and a saturation mode and adjusting the power amplifier may comprise, for example, adjusting the biasing voltage of the power amplifier. More particularly, the power amplifier may comprise a low-noise power amplifier or a high power amplifier.

In a second aspect, at a step 614 it may be determined that the RF-interference indicators indicate that RF interference at the RRH is below the predefined threshold. In this case, at a step 618, the one or more components are adjusted to operate in the active mode. One of the components may comprise a power amplifier having a transistor capable of switching between the active mode and the saturation mode and adjusting the power amplifier may comprise, for example, adjusting the biasing voltage of the power amplifier. More particularly, the power amplifier may comprise a low-noise power amplifier or a high power amplifier.

The methods 500 and 600 occur dynamically (i.e., in real time). Thus, depending on the amount of RF interference in the system, the power amplifier can be rapidly switched between active and saturation modes in order to maintain gain at acceptable levels and maintain RF interference within acceptable limits.

The advantages of the systems and methods described above include having the RRH able to simultaneously have a linear and efficient operation as opposed to one or the other, reducing desensitization of the RRH due to RF interference from inter-modulation products, and the ability to generate a cleaner output signal. With respect to the system illustrated in FIG. 4, by incorporating a linear power amplifier only when needed, the life of this power amplifier is increased, and heat generation from the power amplifier is reduced. Additionally, because of the reduction in RF interference at the RRH, the amount of requests for information from the user devices are reduced, thereby reducing the number of re-transmissions by the user devices which prolongs the battery life of these devices and frees up resources at the RRH.

Many different arrangements of the various components depicted, as well as components not shown, are possible without departing from the scope of the claims below. Embodiments of our technology have been described with the intent to be illustrative rather than restrictive. Alternative embodiments will become apparent to readers of this disclosure after and because of reading it. Alternative means of implementing the aforementioned can be completed without departing from the scope of the claims below. Certain features and subcombinations are of utility and may be employed without reference to other features and subcombinations and are contemplated within the scope of the claims.

What is claimed is:

1. One or more non-transitory computer-readable media having computer executable instructions embodied thereon that, when executed, perform a method of mitigating radio-frequency (RF) interference at a remote radio head (RRH) of a base station due to non-linearity in one or more of the RRH components including at least a power amplifier, wherein the power amplifier is configured to operate in an at least an active mode and a saturation mode, the method comprising:

receiving RF-interference indicators from a plurality of user devices communicating with the base station;

using the RF-interference indicators:

adjusting the power amplifier such that the power amplifier operates in the active mode when the RF-interference indicators indicate that RF interference at the RRH is below a predefined threshold; and adjusting the power amplifier such that the power amplifier operates in the saturation mode when the RF-interference indicators indicate that RF interference at the RRH is above the predefined threshold.

2. The media of claim 1, wherein the power amplifier includes a field-effect transistor (FET).

3. The media of claim 2, wherein the FET comprises a metal-oxide-semiconductor FET (MOSFET).

4. The media of claim 1, wherein the RF-interference indicators comprise one or more of received signal strength indication (RSSI), reference signal received power (RSRP), bit error rate (BER), block error rate (BLER), signal-to-noise ratio (SNR), and signal-to-interference-plus-noise ratio (SINR).

5. The media of claim 1, wherein the predefined threshold is configured by a wireless-telecommunications-network associated with the base station.

6. The media of claim 1, wherein adjusting the power amplifier such that the power amplifier operates in the active mode comprises adjusting the biasing voltage of the power amplifier.

7. The media of claim 1, wherein adjusting the power amplifier such that the power amplifier operates in the saturation mode comprises adjusting the biasing voltage of the power amplifier.

8. A remote radio head (RRH) system of a base station, the RRH system comprising:

a first non-linear power amplifier;

a second linear power amplifier; and a logic unit programmably coupled to both the first non-linear power amplifier and the second linear power amplifier, the logic unit adapted to:

monitor radio-frequency (RF) interference at the RRH, activate the first non-linear power amplifier when the RF interference is below a predefined threshold, and activate the first non-linear power amplifier and the second linear power amplifier when the RF interference is above the predefined threshold.

9. The system of claim 8, wherein the first non-linear power amplifier is serially-coupled to the second linear power amplifier.

10. The system of claim 8, wherein monitoring the RF interference at the RRH system comprises receiving a plurality of RF-interference indicators from one or more user devices communicating with the base station.

11. The system of claim 10, wherein the plurality of RF-interference indicators comprises one or more of received signal strength indication (RSSI), reference signal received power (RSRP), bit error rate (BER), block error rate (BLER), signal-to-noise ratio (SNR), and signal-to-interference-plus-noise ratio (SINR).

12. The system of claim 8, wherein the predefined threshold is configured by a wireless-telecommunications-network associated with the base station.

13. A computerized method carried out by at least one server having at least one processor for mitigating radio-frequency (RF) interference at a remote radio head (RRH) system of a base station due to non-linearity in at least one of the RRH components, the method comprising:

monitoring RF-interference indicators received from a plurality of user devices communicating with the base station;

determining that the RF-interference indicators indicate at least one of: 1) that RF interference at the RRH system is above a predefined threshold, or 2) that RF interference at the RRH system is below the predefined threshold, wherein:

when the RF interference is above the predefined threshold, adjusting the at least one of the RRH components such that the at least one component is operating in a saturation mode; and when the RF interference is below the predefined threshold, adjusting the at least one component such that the at least one component is operating in an active mode.

14. The computerized method of claim 13, wherein the RF interference is due to intermodulation products produced by the at least one component.

15. The computerized method of claim 13, wherein the at least one component comprises a power amplifier.

16. The computerized method of claim 15, wherein the power amplifier includes a field-effect transistor (FET).

17. The computerized method of claim 15, wherein the power amplifier comprises a low-noise amplifier.

18. The computerized method of claim 15, wherein the power amplifier comprises a high power amplifier.

19. The computerized method of claim 13, wherein the RF-interference indicators comprise one or more of received signal strength indication (RSSI), reference signal received power (RSRP), bit error rate (BER), block error rate (BLER), signal-to-noise ratio (SNR), and signal-to-interference-plus-noise ratio (SINR).

20. The computerized method of claim 13, wherein adjusting the at least one of the RRH components such that the at least one component is operating in the saturation mode comprises adjusting the biasing voltage of the at least one component, and wherein adjusting the at least one of the RRH components such that the at least one component is operating in the active mode comprises adjusting the biasing voltage of the at least one component.

\* \* \* \* \*